(12) United States Patent
Muralidhar et al.

(10) Patent No.: US 7,947,589 B2
(45) Date of Patent: May 24, 2011

(54) FINFET FORMATION WITH A THERMAL OXIDE SPACER HARD MASK FORMED FROM CRYSTALLINE SILICON LAYER

(75) Inventors: Ramachandran Muralidhar, Mahopac, NY (US); Marwan H. Khater, Astoria, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 72 days.

(21) Appl. No.: 12/552,774

(22) Filed: Sep. 2, 2009

(65) Prior Publication Data

US 2011/0053361 A1  Mar. 3, 2011

(51) Int. Cl.
*H01L 21/3205* (2006.01)

(52) U.S. Cl. ....... 438/585; 216/2; 216/46; 257/E21.038; 257/E21.235; 257/E21.626; 257/E21.64; 257/E21.218; 257/E23.133; 257/E29.131; 257/E29.152; 438/184; 438/230; 438/265; 438/303; 438/595; 438/596; 438/698; 438/712

(58) Field of Classification Search .......................... None
See application file for complete search history.

(56) References Cited

U.S. PATENT DOCUMENTS

| | | | |
|---|---|---|---|
| 7,112,832 B2 | 9/2006 | Orlowski et al. | |
| 7,265,059 B2 | 9/2007 | Rao et al. | |
| 2007/0181947 A1* | 8/2007 | Chan et al. | 257/351 |

OTHER PUBLICATIONS

Chan et al. ("Three-Dimensional Stacked-Fin-CMOS Integrated Circuit Using Double Layer SOI Material", 7th International Conference on Solid-state and Integrated Circuits, pp. 81-85, 2004).*
Y.K. Choi et al., Spacer FinFET: Nano-Scale CMOS Technology for the Terabit Era, IEEE Electron Device Letters, vol. 23, Issue: 1, Publication Date: Jan. 2002, pp. 25-27.
S.H. Tang et al., FinFET—A Quasi-Planar Double-Gate MOSFET, IEEE Solid-State Circuits Conference, Digest of Technical Papers, Feb. 5, 2001-Feb. 7, 2001, pp. 118-119, 437.

* cited by examiner

*Primary Examiner* — Charles D Garber
*Assistant Examiner* — Yasser A Abdelaziez
(74) *Attorney, Agent, or Firm* — Hamilton & Terrile, LLP; Michael Rocco Cannatti

(57) ABSTRACT

A semiconductor process and apparatus provide a FinFET device by forming a second single crystal semiconductor layer (19) that is isolated from an underlying first single crystal semiconductor layer (17) by a buried insulator layer (18); patterning and etching the second single crystal semiconductor layer (19) to form a single crystal mandrel (42) having vertical sidewalls; thermally oxidizing the vertical sidewalls of the single crystal mandrel to grow oxide spacers (52) having a substantially uniform thickness; selectively removing any remaining portion of the single crystal mandrel (42) while substantially retaining the oxide spacers (52); and selectively etching the first single crystal semiconductor layer (17) using the oxide spacers (52) to form one or more FinFET channel regions (92).

20 Claims, 4 Drawing Sheets

FINFET FORMATION WITH A THERMAL OXIDE SPACER HARD MASK FORMED FROM CRYSTALLINE SILICON LAYER

BACKGROUND OF THE INVENTION

1. Field of the Invention

The present invention is directed in general to the field of semiconductor devices. In one aspect, the present invention relates to high-performance field effect transistor devices.

2. Description of the Related Art

As semiconductor device scaling continues into the nanoscale regime, the ability to control leakage currents and otherwise develop manufacturable devices becomes more difficult. Double-gate MOSFET technologies, such as FinFET devices, have been developed to overcome such limitations to transistor scaling. While thinner body FinFET devices can be used to obtain more aggressive gate length scaling, to suppress short-channel effects, and to increase the effective channel width by combining multiple fins, the ability to fabricate fin structures with tight or narrow pitches was conventionally limited by capabilities of standard photolithography technologies. Prior attempts to overcome the limitations of photolithographic technologies have proposed spacer lithography hard mask techniques which form spacers on an etched sacrificial polysilicon layer, and then use the spacers as hard masks when forming the underlying fin structures. However, there are certain disadvantages with these conventional solutions in terms of pattern fidelity, critical dimension variation, and pattern density that result from non-uniformities in the polysilicon mandrel spacing and line width caused by variations in the trim and etch processes, as well as non-uniformities in the spacer width caused by variations in the spacer formation processes.

Accordingly, a need exists for an improved semiconductor manufacturing process for forming FinFET transistor devices that address various problems in the art that have been discovered by the above-named inventors where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

BRIEF DESCRIPTION OF THE DRAWINGS

The present invention may be understood, and its numerous objects, features and advantages obtained, when the following detailed description is considered in conjunction with the following drawings, in which.

Figure 1:
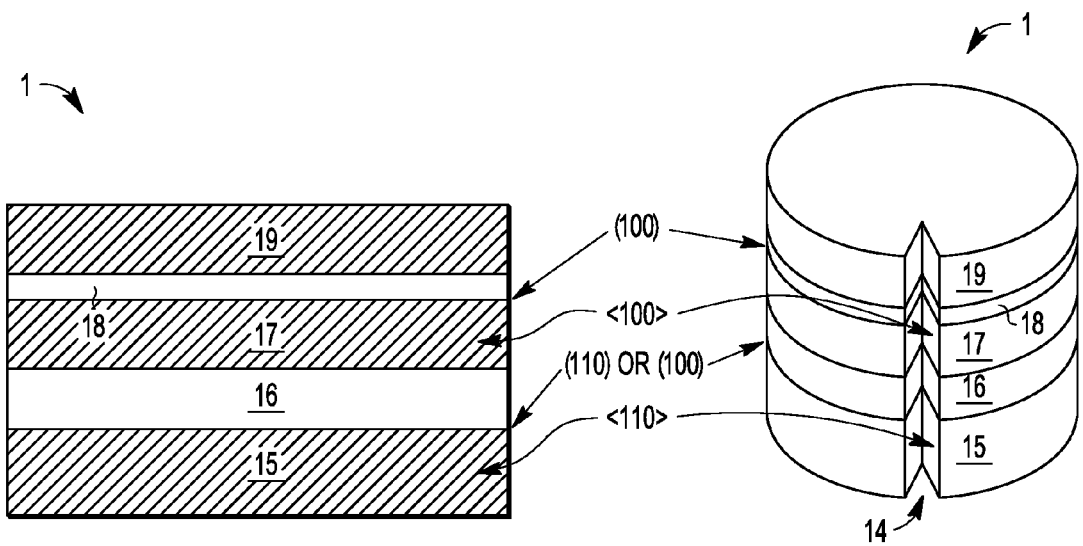
FIG. 1 is a partial cross-sectional view of a semiconductor wafer structure on which a double semiconductor on insulator ("SOI") structure is formed over a semiconductor substrate.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A method and apparatus are described for fabricating high performance FinFET devices using a double SOI starting substrate where the top SOI semiconductor layer is patterned to form a mandrel of patterned features which are used to pattern the bottom SOI semiconductor layer to form fin structures with tight control of fin pitch and fin thickness. After selectively patterning and trimming the top SOI semiconductor layer to form single crystal dummy structures, the sidewalls of the dummy structures are thermally oxidized to form uniform oxide sidewall spacers. The oxide sidewall spacers remain in place after the remaining dummy structures are removed, and are used as hard mask to pattern the bottom SOI semiconductor layer. By thermally oxidizing the single crystal silicon in the top SOI semiconductor layer, the oxide sidewall spacers can be formed in a controllable and uniform fashion to a desired spacer width to serve as the fin thermal oxide hardmask, thereby reducing fin line edge roughness that can be caused by conventional techniques. As a result, fin structures can be patterned at tight pitches with controlled width and uniformity at the 22 nm technology node and beyond. For example, at the 15 nm node, the expected fin thickness is about 8-10 nm.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Turning now to FIG. 1, a partial cross-sectional view is illustrated of a semiconductor wafer structure 1 on which a double semiconductor on insulator ("SOI") structure 16-19 is formed over a semiconductor substrate 15. Specifically, the structure 1 includes a first semiconductor layer 15 formed of a semiconductor material that has a first crystallographic orientation. Depending on the type of transistor device being fabricated, the first semiconductor layer 15 may be implemented as a bulk silicon substrate, single crystalline silicon (doped or undoped), SOI substrate, or any semiconductor material including, for example, Si, SiC, SiGe, SiGeC, Ge, GaAs, InAs, InP as well as other Group VI and/or III-IV and/or II-VI compound semiconductors or any combination thereof, and may optionally be formed as the bulk handling wafer. As will be appreciated, the semiconductor layer 15 may be appropriately doped to provide n-type (electron) and p-type (hole) carriers.

The crystallographic orientation of the first semiconductor layer 15 may be (110), (111), or (100).

The wafer structure 1 includes a first or lower SOI structure formed on the semiconductor layer 15, including a first insulator layer 16 formed on the first semiconductor layer 15, and a first SOI semiconductor layer 17 formed on the first insulator layer 16. The first insulator layer 16 will ultimately be used to form a buried oxide (BOX) layer for the first SOI structure, and may have a thickness (e.g., approximately between 100-1500 Angstroms thick) that is sufficiently thick to electrically isolate the first semiconductor layer 15 from the first SOI semiconductor layer 17. The first SOI semiconductor layer 17 is also formed to a predetermined thickness (e.g., approximately between 10-1000 Angstroms thick) with a semiconductor material having a single crystal structure with a crystallographic orientation which is the same as or different from the first crystallographic orientation. Depending on the type of transistor device being fabricated, the first SOI semiconductor layer 17 may be formed from any semiconductor material, including, for example, Si, SiC, SiGe, SiGeC, Ge, GaAs, InAs, InP as well as other VI and/or III-IV and/or II-VI compound semiconductors or any combination thereof. It will also be appreciated that the first SOI semiconductor layer 17 may be appropriately doped to provide n-type (electron) and p-type (hole) carriers.

The wafer structure 1 also includes a second or top SOI structure formed on the first SOI structure, including a second insulator layer 18 formed on the first SOI semiconductor layer 17, and a second SOI semiconductor layer 19 formed on the second insulator layer 18. The second insulator layer 18 may be formed from any desired insulating material (such as silicon oxide, silicon nitride, etc.) to have a predetermined thickness (e.g., approximately between 100-1500 Angstroms thick) for electrically isolating the first SOI semiconductor layer 17 from the second SOI semiconductor layer 19. In selected embodiments, the second insulator layer 18 may be used to ultimately form a buried oxide (BOX) layer for the second SOI structure. The second SOI semiconductor layer 19 is also formed to a predetermined thickness (e.g., approximately between 10-1000 Angstroms thick) with a semiconductor material having a single crystal structure with a crystallographic orientation which is the same as or different from the first or second crystallographic orientations. As will be appreciated, the second SOI semiconductor layer 19 may be formed from any semiconductor material, provided that the single crystal structure is substantially maintained.

To form the double semiconductor on insulator ("SOI") structure 16-19 over the semiconductor substrate 15, it will be appreciated that the semiconductor substrate 15 may be formed as part of a handling wafer structure which is bonded to a donor wafer structure which includes either or both of the first or second SOI structures. Though not shown, the donor wafer structure may include a bonding insulator layer that is bonded to a bonding insulator layer on the handling wafer structure with a bonding material or using other bonding techniques, such as by performing electrostatic bonding, followed by thermal bonding or pressure bonding. In the alternative, the first insulator layer 16 on the donor wafer structure may be bonded directly to the first semiconductor layer 15 of the handle wafer structure using any desired bonding technique. In yet another alternative, the double SOI structure 16-19 may be formed in whole or in part by using Separation by IMplantation of OXygen (SIMOX) techniques whereby an oxygen ion beam implantation and high temperature anneal are used to create a buried $SiO_2$ layer 16 and/or 18. In yet other embodiments, seed methods may be used to form the bottom and/or top SOI semiconductor layers 17, 19 by growing the semiconductor layers 17, 19 directly on the underlying insulator layer 16, 18 using a template layer for homoepitaxy which may be achieved by chemical treatment of the insulator, an appropriately oriented crystalline insulator, or vias through the insulator from the underlying substrate. Thus, a variety of different semiconductor fabrication techniques may be used to form one SOI structure over another SOI structure or semiconductor substrate layer so that the relative positioning of forming one layer "over" another is not understood in a literal, directional sense. For example, the handling wafer which includes the semiconductor substrate 15 may be bonded to or compressed with an underlying donor wafer which includes semiconductor layer 17, but the final structure includes a semiconductor layer 17 that is formed over the semiconductor substrate 15.

In selected embodiments, the wafer structure 1 can be fabricated so that the crystal orientation of the first SOI semiconductor layer 17 is twisted or rotated 45 degrees with respect to the crystal orientation of the first semiconductor layer 15. For example, the crystallographic orientation of the first SOI semiconductor layer 17 may be (100), (111), or (110), so long as the crystallographic orientation of the first SOI semiconductor layer 17 differs from the crystallographic orientation of the first semiconductor layer 15. In addition and as shown with the perspective cross-sectional view of the wafer structure 1, the first SOI semiconductor layer 17 may have a (100) top surface orientation and a <100> channel direction in the notch 14, while the first semiconductor layer 15 may have a (100) or (110) top surface orientation and a <110> channel direction in the notch 14. The crystal orientations of the first semiconductor layer 15 and the first SOI semiconductor layer 17 will depend on the materials used to form the wafer structure 1. For example, when silicon is employed as the semiconductor material, electron mobility is higher on a (100) surface orientation, and hole mobility is higher on a (110) surface orientation, provided that the channel direction is oriented in the <110> direction. In this case, the (100) Si surface is used as the substrate layer for NMOS devices, while the (110) Si surface is used to form the substrate layer for PMOS devices.

Figure 2:
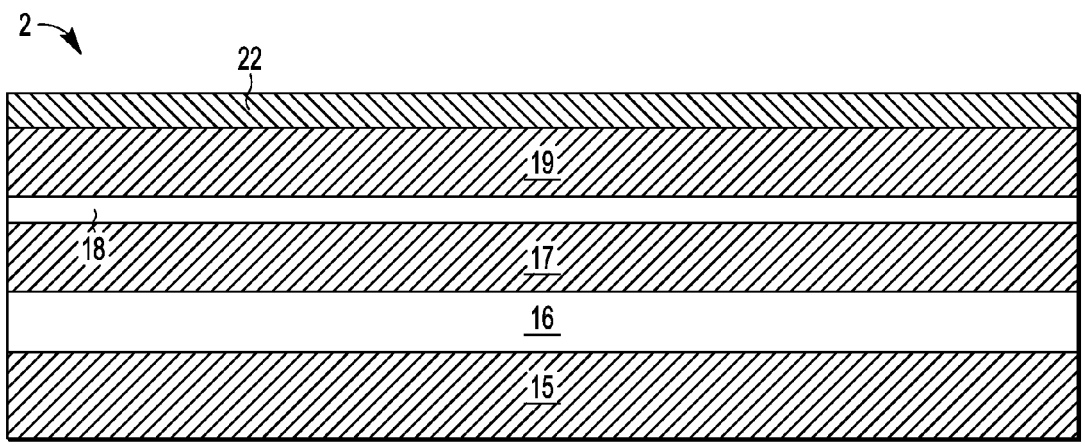
FIG. 2 illustrates processing subsequent to FIG. 1 after depositing a nitride hard mask layer.

FIG. 2 illustrates processing of a semiconductor wafer structure 2 subsequent to FIG. 1 after depositing a nitride hard mask layer 22 over the double SOI structure 16-19. Though not explicitly shown, a relatively thin protective pad oxide layer may be formed over the second SOI semiconductor layer 19 to a predetermined thickness of roughly 20 Angstroms to 120 Angstroms, and more particularly approximately 50 Angstroms, though any desired thickness may be used. The pad oxide layer may be formed by thermally growing an oxide material (such as silicon dioxide, nitrided silicon oxide, metal oxide or multi-metal oxide) on the second SOI semiconductor layer 19, though any desired technique may be used, such as chemical vapor deposition (CVD), plasma-enhanced chemical vapor deposition (PECVD), physical vapor deposition (PVD), atomic layer deposition (ALD), thermal oxidation, or any other technique for depositing or growing an oxide layer. After forming the pad oxide layer, a first mask layer 22 is formed to a predetermined thickness over the second SOI semiconductor layer 19 with an appropriate masking material, such as nitride. In various embodiments, the nitride mask layer 22 is formed to a thickness of between approximately 250-2500 Angstroms, and more particularly approximately 700-1000 Angstroms, though any desired thickness may be used. The nitride mask layer 22 may be formed by depositing a layer of silicon nitride, silicon oxynitride, silicon-rich variants thereof, composites of any of these materials, or some other appropriate masking material using any desired technique, such as PECVD, CVD, PVD, ALD, or the like.

Figure 3:
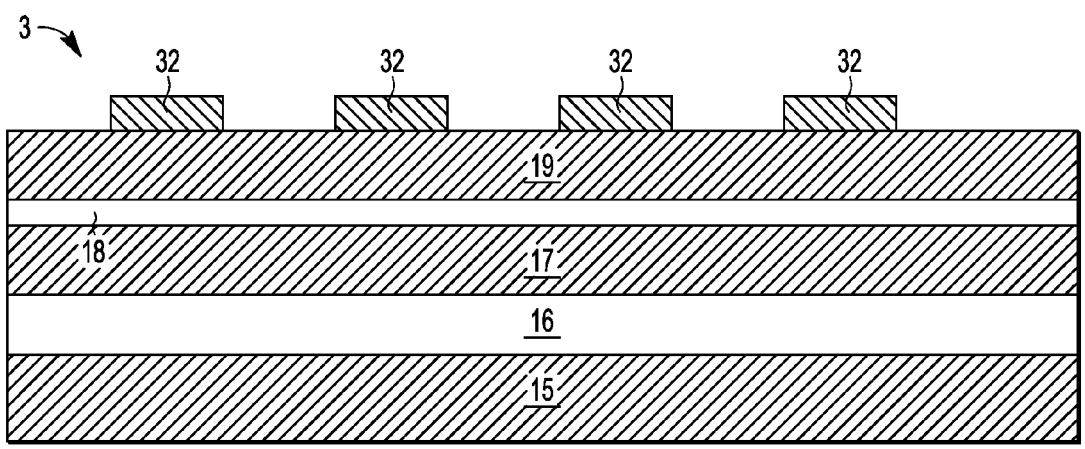
FIG. 3 illustrates processing subsequent to FIG. 2 after selectively patterning and etching the nitride hard mask layer to form a mandrel etch mask.

FIG. 3 illustrates processing of a semiconductor wafer structure 3 subsequent to FIG. 2 after selectively patterning and etching the nitride hard mask layer 22 to form a mandrel etch mask 32. Any desired pattern and etch sequence may be used to selectively etch the nitride hard mask layer 22, such as by depositing an etch mask material (not shown) directly on the nitride mask layer using any desired technique, such as PECVD, CVD, PVD, ALD, or the like, and then optically patterning the etch mask material to form an etch mask that is used to pattern and etch the nitride hard mask layer 22. In selected example embodiments, a layer of photoresist is deposited to a predetermined thickness that is selected to provide a photo etch protection property for any subsequent photo etch processes that are used to form the mandrel etch mask 32 by creating openings in the nitride mask layer 22. The patterned photoresist is then transferred to the nitride hard mask layer 22 using one or more etching steps to selectively remove the unprotected portions of the nitride hard mask layer 22, including a dry etching process such as reactive-ion etching, ion beam etching, plasma etching or laser etching, a wet etching process wherein a chemical etchant is employed or any combination thereof. Alternatively, multi-layer masking techniques may also be used, such as by sequentially depositing or forming a first masking layer (such as an organic anti-reflective coating (ARC) layer), a second masking layer (such as a hardmask or TEOS layer) and a photoresist layer (not shown). As shown in FIG. 3, the patterned photoresist is removed after the etch process using any desired chemical etch or strip process.

Figure 4:
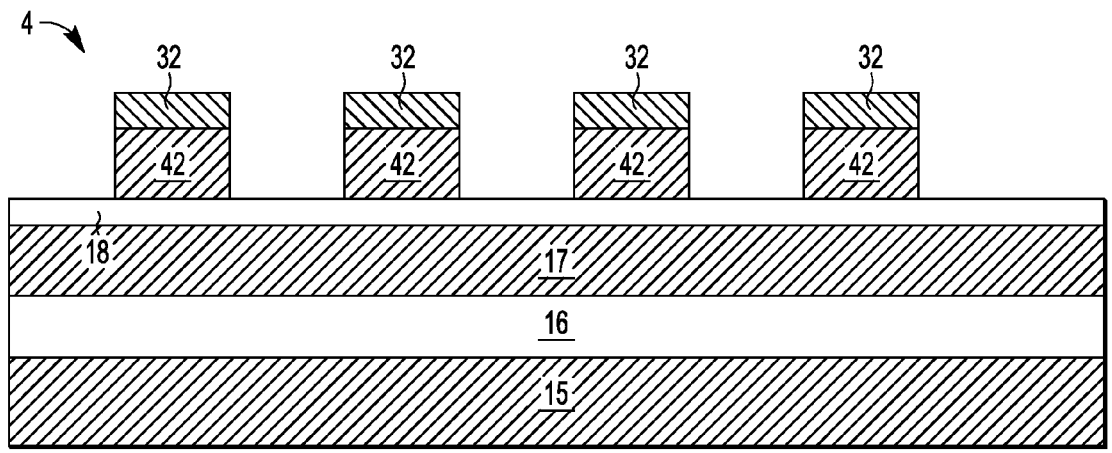
FIG. 4 illustrates processing subsequent to FIG. 3 after selectively etching exposed portions of the top SOI semiconductor layer to form crystalline semiconductor mandrel structures.

FIG. 4 illustrates processing of a semiconductor wafer structure 4 subsequent to FIG. 3 after using the mandrel etch mask 32 to selectively etch exposed portions of the top SOI semiconductor layer 19 to form crystalline semiconductor mandrel structures 42. With the mandrel etch mask 32 in place, portions of the top SOI semiconductor layer 19 may be selectively etched or removed using one or more etching steps to selectively remove the unprotected portions of the top SOI semiconductor layer 19, including a dry etching process such as reactive-ion etching, ion beam etching, plasma etching or laser etching, a wet etching process wherein a chemical etchant is employed or any combination thereof. By choosing an anisotropic etch chemistry that is selective to oxide, only the exposed portions of the top SOI semiconductor layer 19 are removed, and the etch process stops at the underlying second insulator layer 18.

As shown in FIG. 4, the mandrel structures 42 are formed with a semiconductor material having a substantially uniform single crystal structure (e.g., monocrystalline silicon) with equal lines and spaces between the separate mandrel structures. Though not shown, the single crystalline mandrel structures 42 may be trimmed at this point in the fabrication process by applying a controlled thermal oxidation process to convert any exposed surfaces of the mandrel structures 42 to silicon dioxide in a much more controlled process than would be possible with using a reactive ion etch trim process.

Figure 5:
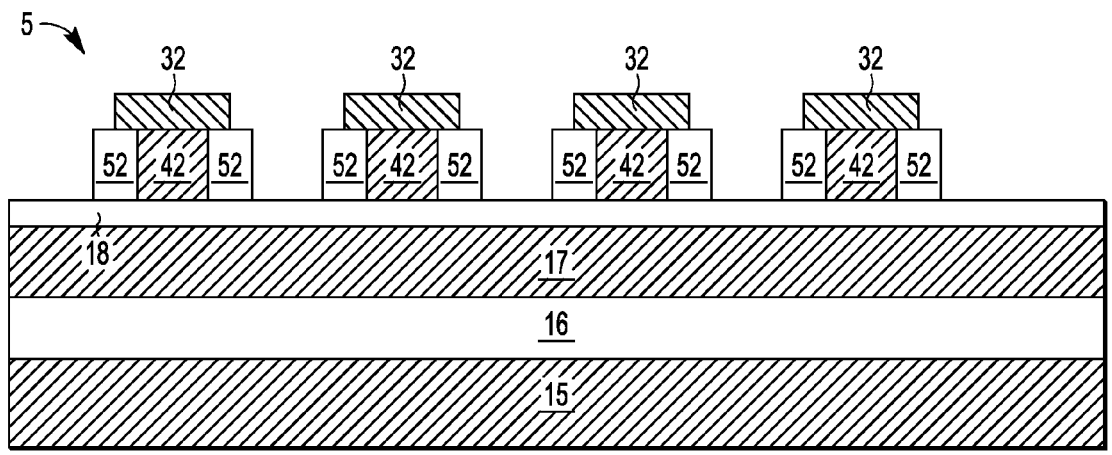
FIG. 5 illustrates processing subsequent to FIG. 4 after forming oxide sidewall spacers by thermally oxidizing the crystalline semiconductor mandrel structures.

FIG. 5 illustrates processing of a semiconductor wafer structure 5 subsequent to FIG. 4 after forming oxide sidewall spacers 52 by a thermal oxidation process which grows silicon dioxide spacers at the exposed sidewalls of the crystalline semiconductor mandrel structures 42. While any desired thermal oxidation process can be used to form the oxide sidewall spacers, in selected example embodiments, the crystalline semiconductor mandrel structures 42 are oxidized by exposing the wafer structure 5 to oxygen, nitrous oxide, nitric oxide, or steam in a wet/dry environment at a temperature in the range of approximately 700 to 1000 degrees Celsius for purposes of forming spacers having a width of approximately 8-10 nm, though other oxidation processes can be used to obtain different sidewall thicknesses. Whatever thermal oxidation process is used, a uniform layer of silicon dioxide is formed at the exposed sidewalls of the crystalline semiconductor mandrel structures 42, and not elsewhere on the semiconductor wafer structure 15 (except for some slight thickening of the second insulator layer 18). By thermally oxidizing the single crystal semiconductor mandrel structures 42 in a controllable fashion, a thermal oxide hard mask is formed having the desired spacer width, and the line edge roughness is reduced as compared to oxide growth processes from a polycrystalline silicon mandrel (because poly silicon is susceptible to grain boundary oxidation) or to spacer formation processes which use deposition and anisotropic etch techniques. The thickness of the thermal oxide that is grown on the mandrel sidewalls determines the final fin width so that extremely small fin widths can be obtained that are well below the lithographic limit.

Figure 6:
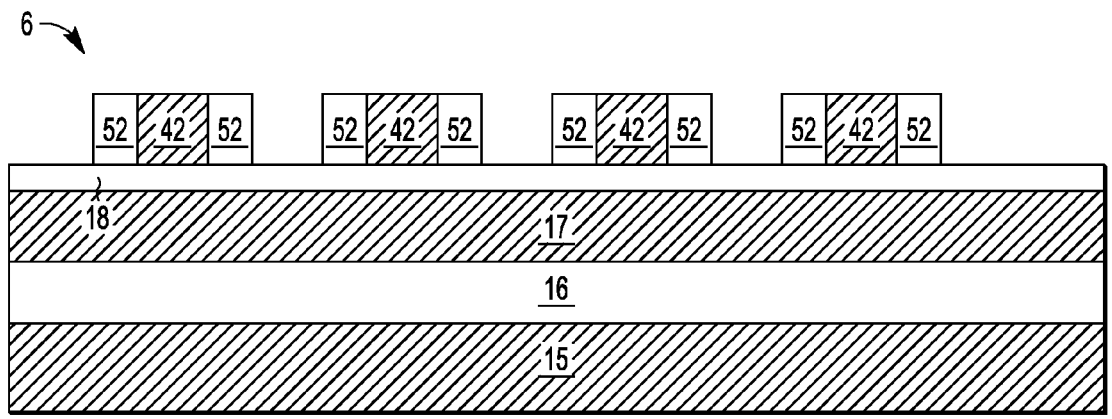
FIG. 6 illustrates processing subsequent to FIG. 5 after removing the nitride mandrel etch mask.

FIG. 6 illustrates processing of a semiconductor wafer structure 6 subsequent to FIG. 5 after removing the nitride mandrel etch mask 32. When removing the nitride mandrel etch mask 32, any desired stripping process may be used that is capable of selectively removing the nitride, including but not limited to, one or more wet etching processes wherein a chemical etchant is employed to remove the nitride mandrel etch mask 32. For example, an isotropic or wet etch process may be employed by using a silicon nitride etch chemistry, such as a hot phosphoric acid ($H_3PO_4$) solution or another appropriate selective etchant to remove the nitride mandrel etch mask 32 while leaving in place the second insulator layer 18, semiconductor mandrel structures 42 and oxide sidewall spacers 52.

Figure 7:
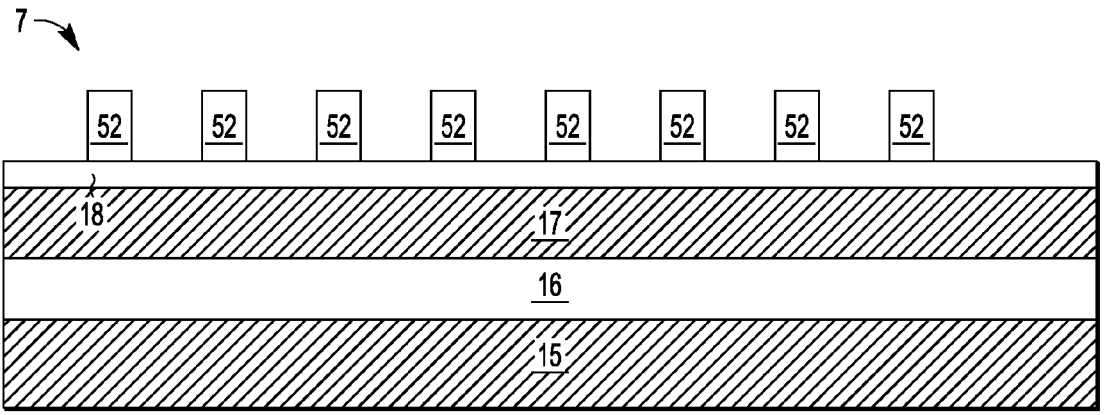
FIG. 7 illustrates processing subsequent to FIG. 6 after the removing the remaining crystalline semiconductor mandrel structures.

FIG. 7 illustrates processing of a semiconductor wafer structure 7 subsequent to FIG. 6 after the removing the remaining crystalline semiconductor mandrel structures 42. The semiconductor mandrel structures 42 may be removed using any desired etch process that is capable of selectively removing the semiconductor material without substantially removing the oxide sidewall spacers 52 and second insulator layer 18, including but not limited to, one or more dry or wet etching processes and/or a reactive ion etch process which is employed to selectively remove the semiconductor mandrel structures 42, alone or in combination with a soft landing etch, clean overetch, and post-etch cleaning. For example, a silicon etch chemistry may be employed, such as a Standard Clean 1 (SC-1) solution of $H_2O:NH_4OH:H_2O_2$, a $NH_4OH$ wet clean solution at 65 degrees Celsius, or a combination of nitric acid and HF acid solution or another appropriate selective etchant to remove the single crystal semiconductor mandrel structures 42 while leaving in place the second insulator layer 18 and oxide sidewall spacers 52. Alternatively, well known techniques for silicon RIE can be used.

Figure 8:
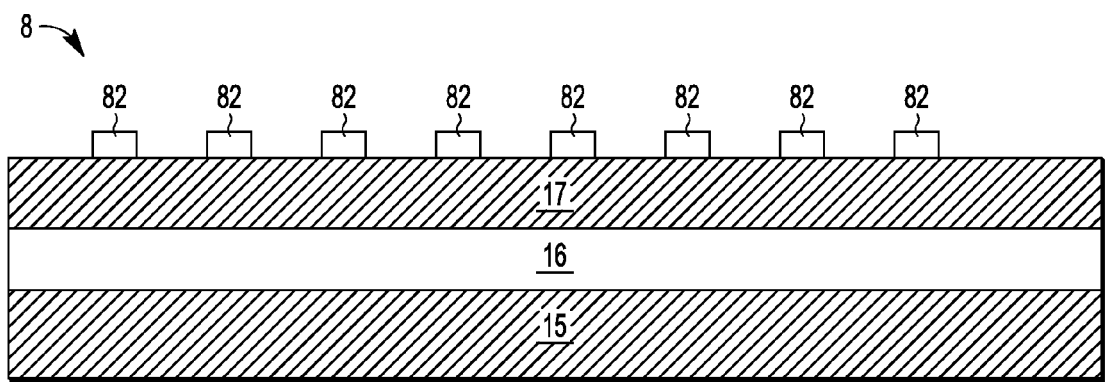
FIG. 8 illustrates processing subsequent to FIG. 7 after removing the exposed portions of the top SOI oxide layer to expose the bottom SOI semiconductor layer.

FIG. 8 illustrates processing of a semiconductor wafer structure 8 subsequent to FIG. 7 after removing the exposed portions of the top SOI oxide layer 18 to expose the bottom SOI semiconductor layer 17, such as by employing one or more dry or wet etching processes (e.g., HF acid solution) and/or a reactive ion etch process which is employed to remove the top SOI oxide layer 18. In the depicted example in which exposed portions of the top SOI oxide layer 18 are removed using the oxide sidewall spacers 52 as a mask, a timed etch process is used which is controlled to remove the exposed portions of the top SOI oxide layer 18 while recessing or etching back the oxide sidewall spacers 52. This process creates patterned hardmask structures 82 which are formed form the unetched portions of the top SOI oxide layer 18 and the recessed oxide sidewall spacers 52 and which have sufficient thickness to serve as an etch mask for the underlying first SOI semiconductor layer 17. In an alternative embodiment where the oxide sidewall spacers 52 and second insulator layer 18 are formed with materials that may be selectively etched, a selective etch process may be used to remove exposed portions of the second insulator layer 18 using the oxide sidewall spacers 52 as an etch mask, followed by removal of the oxide sidewall spacers 52. This alternative process creates patterned hardmask structures 82 which are formed form the unetched portions of the second insulator layer 18 having sufficient thickness to serve as an etch mask for the underlying first SOI semiconductor layer 17.

Figure 9:
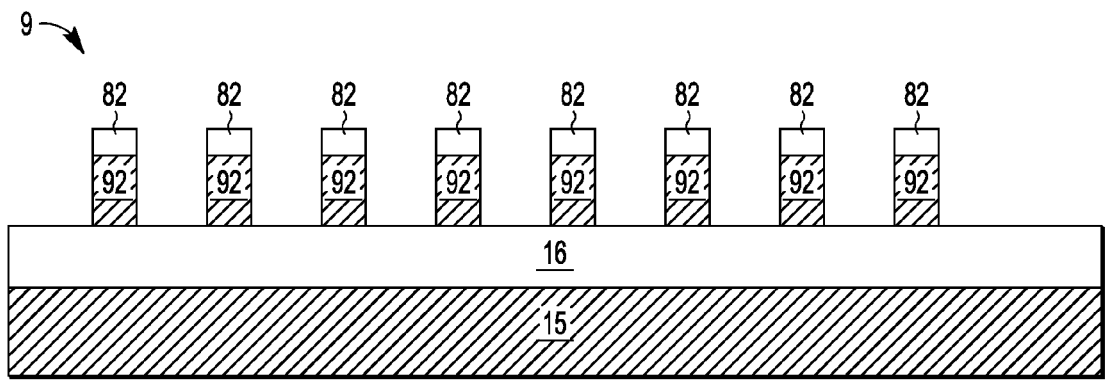
FIG. 9 illustrates processing subsequent to FIG. 8 after selectively etching the exposed portions of the bottom SOI semiconductor layer to form the fin structures.

FIG. 9 illustrates processing of a semiconductor wafer structure 9 subsequent to FIG. 8 after selectively etching the exposed portions of the bottom SOI semiconductor layer 17 to form the fin structures 92 which will serve as the channel or body portions of FinFET transistor devices. For example, the openings formed in the thermal oxide spacer hard mask 82 is extended through the bottom SOI semiconductor layer 17 using any desired reactive ion etch (RIE) or like composite selective plasma operations. While the openings are shown as being formed down to the first insulator layer 16, it will be appreciated that the etch process used to form the openings may etch down to the underlying substrate 15. Alternatively, the etch can be timed to stop after partially etching the semiconductor layer 17. As will be appreciated, the illustration of FIG. 9 depicts a particular cross-section of the semiconductor structure 9 where the channel or body portions of FinFET transistor devices are located, and does not depict other device features. For example, a plurality of fin structures 92 may be connected between a source region and a drain region (not shown), thereby creating a multi-fingered FET device having a plurality of fin structures connecting one source region to one drain region. Thus, the source and drain regions that are also formed from the bottom SOI semiconductor layer 17 "in front of" and "behind" the depicted cross section are not depicted in FIG. 9.

Though not separately shown, the pattern and etch process described herein may also be used to form channel or body portions of the FinFET transistor devices by defining fin structures from a semiconductor layer that is epitaxially grown from the semiconductor substrate 15. In this way, the crystal orientations of the vertical and horizontal surfaces of the body regions of different fin structures may be controlled. For example, in a selected embodiment, a first body region formed from the semiconductor layer that is epitaxially grown from the semiconductor substrate 15 may have a channel direction of <110>, a vertical sidewall surface with a (100) orientation, and a horizontal top surface with either a (110) or (100) orientation. In addition, a second body region formed from the bottom SOI semiconductor layer 17 may have a channel direction of <100>, vertical sidewall surface with a (100) orientation, and a horizontal top surface with a (100) orientation. In this example, the first body regions may be used to fabricate PMOS FinFET devices, while the second body region may be used to fabricate NMOS FinFET devices.

Figure 10:
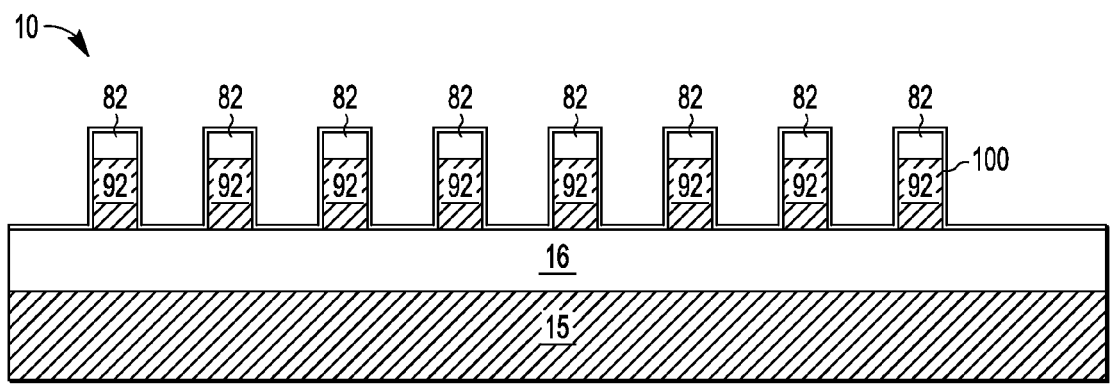
FIG. 10 illustrates processing subsequent to FIG. 9 after a dielectric layer is formed over the fin structures.

FIG. 10 illustrates processing of a semiconductor wafer structure 10 subsequent to FIG. 9 after a dielectric layer 100 is formed over the fin structures 92 and thermal oxide spacer hard mask 82. In selected embodiments, the dielectric layer 100 is formed by depositing or growing an insulator or high-k dielectric (e.g., silicon dioxide, oxynitride, metal-oxide, nitride, hafnium oxide, hafnium silicate, zirconium oxide, zirconium silicate, etc.) using chemical vapor deposition (CVD), plasma-enhanced chemical vapor deposition (PECVD), physical vapor deposition (PVD), atomic layer deposition (ALD), thermal oxidation, or any combination(s) of the above, so that the top and sides of the fin structures 92 are covered with a dielectric layer. As shown in FIG. 10, the dielectric layer 100 is deposited over the retained thermal oxide spacer hard mask 82 and on the sidewalls of the fin structures 92, thereby forming fin structures that are suitable for use in fabricating double gate FinFET transistor devices. As will be appreciated, double gate FinFET transistor devices may also be formed by growing a dielectric layer on the sidewalls of the fin structures without removing the thermal oxide spacer hard mask 82, such as by thermally growing a silicon dioxide layer from the exposed sidewalls of the fin structures 92. Though not shown in FIG. 10, the thermal oxide spacer hard mask 82 may first be removed from the fin structures 92 using an appropriate oxide etchant process before forming a gate dielectric layer on the top and sides of the fin structures. With this approach, the gate dielectric layer may be grown or deposited to a substantially uniform thickness on the top and sides of the cleared fin structures 92, thereby forming fin structures that are suitable for use in fabricating triple gate FinFET transistor devices.

Figure 11:
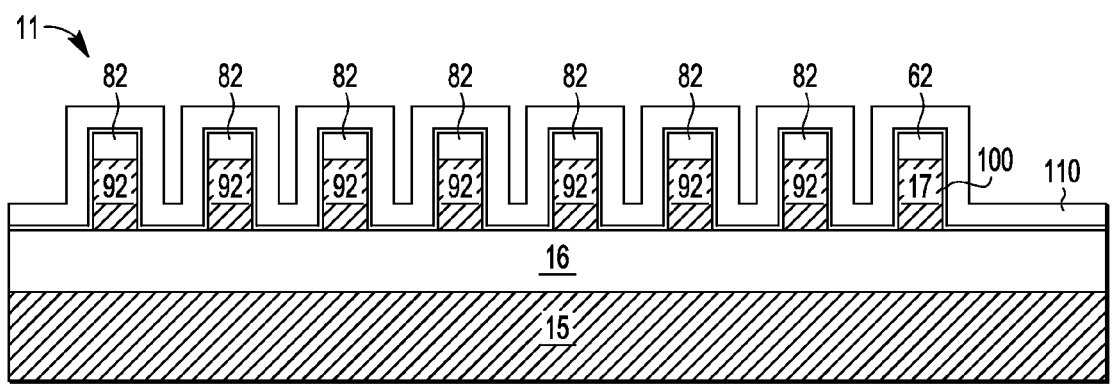
FIG. 11 illustrates processing subsequent to FIG. 10 after a conductive gate layer is formed over the dielectric layer.

FIG. 11 illustrates processing of a semiconductor wafer structure 11 subsequent to FIG. 10 after a conductive gate layer 110 is formed over the dielectric layer 100. In selected embodiments, the conductive gate layer 110 may be formed by depositing or forming a first conductive material (e.g., polysilicon, SiGe and/or a metallic layer) having a thickness in the range of 1-200 nanometers over the wafer structure 11 to cover the dielectric layer 100 formed on the body portions 92 of the FinFET transistor devices. Though not shown in FIG. 11, the conductive layer 110 may also cover other regions of the wafer structure 11 to form gate electrodes for the FinFET and planar MOSFET transistor devices. Subsequently, any desired gate pattern and etch processing steps may be used to form the desired etched gates over the FinFET body portions 92.

Figure 12:
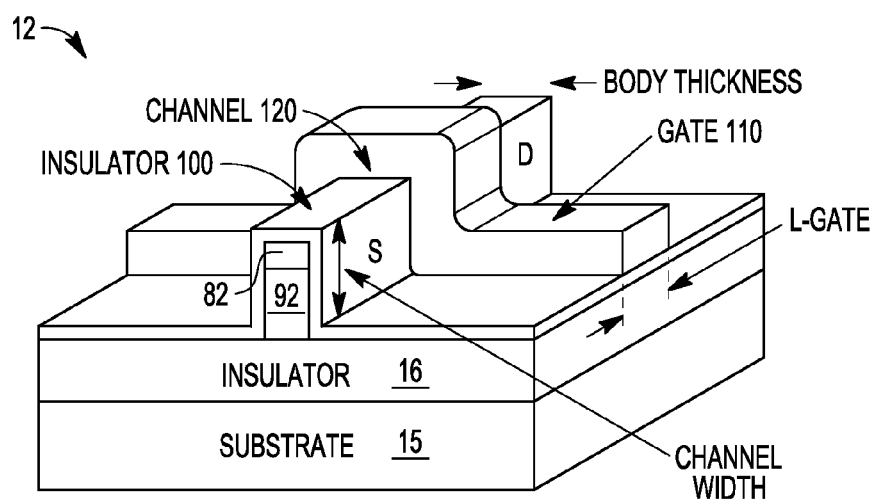
FIG. 12 illustrates processing subsequent to FIG. 11 with a perspective view of the FinFET devices after selective removal of the conductive gate layer.

The result of the gate etch process is illustrated in FIG. 12, which depicts perspective views of the SOI FinFET 12 formed after selective removal of the conductive gate layer 110. In particular, the SOI FinFET device 12 illustrates a FinFET transistor device formed over and insulated from a substrate 15 (e.g., the first semiconductor layer) by one or more insulator layers 16, and includes a channel 120 formed from a semiconductor fin structure 92 that connects source and drain regions and that is covered on the top and sides by a gate layer 110. A body tie (not shown) to the fin structure can be provided when formed from a semiconductor layer that is epitaxially grown from the semiconductor substrate 15. The channel 120 is defined by body thickness and channel width dimensions, while the gate layer 110 is defined by a gate length (L-gate) dimension. In a selected embodiment, these dimensions may be separately controlled for the FinFET devices in different device regions (e.g., NMOS and PMOS device regions).

It will be appreciated that additional processing steps will be used to complete the fabrication of the FinFET transistor devices. As examples, one or more sacrificial oxide formation, stripping, isolation region formation, well region formation, gate formation, extension implant, halo implant, spacer formation, source/drain implant, heat drive or anneal steps, and polishing steps may be performed, along with conventional backend processing (not depicted), typically including formation of multiple levels of interconnect that are used to connect the transistors in a desired manner to achieve the desired functionality. Thus, the specific sequence of steps used to complete the fabrication of the semiconductor structures may vary, depending on the process and/or design requirements.

By now it should be appreciated that there has been disclosed a method for fabricating a FinFET transistor device with a thermal oxide spacer hard mask formed from crystalline semiconductor layer. As disclosed, a substrate structure (e.g., a double SOI substrate structure) is provided that includes a first single crystal semiconductor layer formed over an underlying first insulator layer, and also includes a second single crystal semiconductor layer formed over the first single crystal semiconductor layer, where the second single crystal semiconductor layer is isolated from the first single crystal semiconductor layer by an underlying second insulator layer. The second single crystal semiconductor layer is patterned and etched to form a single crystal mandrel or patterned structure having vertical sidewalls. In an example embodiment, the second single crystal semiconductor layer is patterned and etched by depositing a first hard mask layer (e.g., a nitride layer) over the second single crystal semiconductor layer, patterning and etching the first hard mask layer to form a mandrel etch mask (e.g., a nitride hard mask), and selectively etching the second single crystal semiconductor layer (e.g., by applying a reactive ion etch) using the mandrel etch mask to form the single crystal mandrel having vertical sidewalls. Oxide spacers having a substantially uniform thickness are then grown by oxidizing the vertical sidewalls of the single crystal mandrel/patterned structure, thereby forming an oxide spacer hard mask. After forming the oxide spacers, the nitride hard mask may be removed from the second single crystal semiconductor layer, and any remaining portion of the underlying second insulator layer may be removed with a reactive ion etch process. With the oxide spacers/hard mask still in place, any remaining portion of the second single crystal semiconductor layer is selectively removed (e.g., with a wet etch process or reactive ion etch process) while substantially retaining the oxide spacers/hard mask. Thereafter, the first single crystal semiconductor layer is selectively etched using the oxide spacers/hard mask to form one or more FinFET channel regions as per the oxide spacers/hard mask. Finally, a gate layer is formed over the FinFET channel regions, and then selectively etched to form one or more gate electrodes over the FinFET channel regions.

In another form, there is provided a method for forming a plurality of FinFET structures on a semiconductor structure. In the disclosed methodology, a substrate structure (e.g., a double SOI substrate structure) is provided or formed which includes a first crystalline semiconductor substrate layer (e.g., bulk semiconductor), a second crystalline semiconductor layer (e.g., an SOI semiconductor layer) formed over at least part of the first semiconductor substrate layer and electrically isolated therefrom by a first insulator layer, and a third crystalline semiconductor layer formed over at least part of the second crystalline semiconductor layer and electrically isolated therefrom by a second insulator layer. The third crystalline semiconductor layer is selectively etched to form a plurality of patterned crystalline semiconductor structures having a predetermined minimum pitch. The selective etch process may include depositing a first hard mask layer over the third crystalline semiconductor layer, patterning and etching the first hard mask layer to form a mandrel etch mask, and selectively etching the third crystalline semiconductor layer using the mandrel etch mask to form the plurality of patterned crystalline semiconductor structures. In other embodiments, the selective etch process may include depositing a first nitride layer over the third crystalline semiconductor layer, patterning and etching the first nitride layer to form a nitride hard mask on the third crystalline semiconductor layer, applying a reactive ion etch to selectively etch the third crystalline semiconductor layer using the nitride hard mask to form the plurality of patterned crystalline semiconductor structures having vertical sidewalls, and then subsequently removing the nitride hard mask from the etched third crystalline semiconductor layer. In this way, the plurality of patterned crystalline semiconductor structures may be formed to have equal line widths and spaces therebetween. The plurality of patterned crystalline semiconductor structures are oxidized to grow oxide sidewall spacers having a substantially uniform thickness. In selected embodiments, the oxide sidewall spacers are formed by thermally oxidizing the plurality of patterned crystalline semiconductor structures in a controlled thermal oxidation process so that the oxide sidewall spacers each have a predetermined thickness on the plurality of patterned crystalline semiconductor structures. The oxide sidewall spacers are then used directly or indirectly as an etch mask to selectively etch the second crystalline semiconductor layer and form a plurality of FinFET channel regions having a minimum pitch that is less than (e.g., half) the predetermined minimum pitch. In selected embodiments, the plurality of FinFET channel regions are formed to have a thickness of about 8-10 nanometers. Finally, a gate insulator layer and conductive gate layer are formed over the plurality of FinFET channel regions, and then selectively etched to form a plurality of FinFET gate electrodes.

In yet another form, there is provided a method for forming a FinFET structure. First, a double semiconductor-on-insulator (SOI) substrate is provided that includes a monocrystalline top SOI layer and a monocrystalline bottom SOI layer. The monocrystalline top SOI layer is then patterned and etched to form an etch mask that includes a plurality of monocrystalline dummy structures having a predetermined minimum pitch. The monocrystalline dummy structures are thermally oxidized to form uniform oxide sidewall spacers. Thereafter, any remaining portion of the monocrystalline dummy structures are removed while substantially retaining the uniform oxide sidewall spacers which are used as an etch mask to selectively etch the monocrystalline bottom SOI layer to form a plurality of FinFET channel regions having a minimum pitch that is less than the predetermined minimum pitch. A gate insulator layer and conductive gate layer are formed over the plurality of FinFET channel regions and selectively etched to form one or more FinFET gate electrodes.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the thickness of the described layers may deviate from the disclosed thickness values, as may the specific sequence of semiconductor processing steps used to form the various features. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the aims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for fabricating a semiconductor structure, comprising:
   providing a substrate structure comprising a first single crystal semiconductor layer over an underlying first insulator layer, and a second single crystal semiconductor layer over the first single crystal semiconductor layer that is isolated from the first single crystal semiconductor layer by an underlying second insulator layer;
   patterning and etching the second single crystal semiconductor layer to form a single crystal patterned structure having vertical sidewalls;
   oxidizing the single crystal patterned structure to grow oxide spacers on the vertical sidewalls of the single crystal patterned structure;
   selectively removing any remaining portion of the single crystal patterned structure while substantially retaining the oxide spacers; and
   selectively etching the first single crystal semiconductor layer using the oxide spacers as a mask to leave one or more FinFET channel regions patterned as per the oxide spacers.

2. The method of claim 1, where providing the substrate structure comprises providing a double semiconductor-on-insulator substrate structure.

3. The method of claim 1, where patterning and etching the second single crystal semiconductor layer comprises:
   depositing a first hard mask layer over the second single crystal semiconductor layer;
   patterning and etching the first hard mask layer to form a mandrel etch mask; and
   selectively etching the second single crystal semiconductor layer using the mandrel etch mask to form the single crystal patterned structure having vertical sidewalls.

4. The method of claim 1, where patterning and etching the second single crystal semiconductor layer comprises:
   depositing a first nitride layer over the second single crystal semiconductor layer;
   patterning and etching the first nitride layer to form a nitride hard mask on the second single crystal semiconductor layer; and
   applying a reactive ion etch to selectively etch the second single crystal semiconductor layer using the nitride hard mask to form the single crystal patterned structure having vertical sidewalls.

5. The method of claim 4, further comprising removing the nitride hard mask from the second single crystal semiconductor layer after oxidizing the single crystal patterned structure and before selectively removing any remaining portion of the single crystal patterned structure.

6. The method of claim 1, where selectively removing any remaining portion of the single crystal patterned structure comprises applying a wet etch process to selectively remove any remaining portion of the single crystal patterned structure while substantially retaining the oxide spacers.

7. The method of claim 1, where selectively removing any remaining portion of the single crystal patterned structure comprises applying a reactive ion etch process to selectively remove any remaining portion of the single crystal patterned structure while substantially retaining the oxide spacers.

8. The method of claim 1, further comprising selectively removing any remaining portion of the underlying second insulator layer with a reactive ion etch process before selectively etching the first single crystal semiconductor layer.

9. The method of claim 1, further comprising:
   forming a gate layer over the FinFET channel regions, and selectively etching the gate layer to form one or more gate electrodes over the FinFET channel regions.

10. A method for forming a plurality of FinFET structures on a semiconductor structure, comprising:
    providing a substrate structure comprising:
       a first crystalline semiconductor substrate layer,
       a second crystalline semiconductor layer over at least part of the first semiconductor substrate layer and electrically isolated therefrom by a first insulator layer, and
       a third crystalline semiconductor layer over at least part of the second crystalline semiconductor layer and electrically isolated therefrom by a second insulator layer;
    selectively etching the third crystalline semiconductor layer to form a plurality of crystalline patterned semiconductor structures having a predetermined minimum pitch;
    oxidizing the plurality of crystalline patterned semiconductor structures to grow a plurality of oxide sidewall spacers on the plurality of crystalline patterned semiconductor structures; and
    selectively etching the second crystalline semiconductor layer using the plurality of oxide sidewall spacers directly or indirectly as an etch mask to form a plurality of FinFET channel regions having a minimum pitch that is less than the predetermined minimum pitch.

11. The method of claim 10, where the first crystalline semiconductor layer comprises a bulk semiconductor substrate layer and the second crystalline semiconductor layer comprises an SOI crystalline semiconductor layer.

12. The method of claim 10, where providing the substrate structure comprises providing a double semiconductor-on-insulator substrate structure.

13. The method of claim 10, where selectively etching the third crystalline semiconductor layer comprises:
depositing a first hard mask layer over the third crystalline semiconductor layer;
patterning and etching the first hard mask layer to form a mandrel etch mask; and
selectively etching the third crystalline semiconductor layer using the mandrel etch mask to form the plurality of crystalline patterned semiconductor structures having the predetermined minimum pitch.

14. The method of claim 10, where oxidizing the plurality of crystalline patterned semiconductor structures comprises thermally oxidizing the plurality of crystalline patterned semiconductor structures in a controlled thermal oxidation process to form oxide sidewall spacers, each having a predetermined thickness on the plurality of crystalline patterned semiconductor structures to form the plurality of oxide sidewall spacers.

15. The method of claim 10, where the plurality of crystalline patterned semiconductor structures are formed to have equal line widths and spaces therebetween.

16. The method of claim 10, where the plurality of FinFET channel regions are formed to have a thickness of about 8-10 nanometers.

17. The method of claim 10, where selectively etching the third crystalline semiconductor layer comprises:
depositing a first nitride layer over the third crystalline semiconductor layer;
patterning and etching the first nitride layer to form a nitride hard mask on the third crystalline semiconductor layer; and
applying a reactive ion etch to selectively etch the third crystalline semiconductor layer using the nitride hard mask to form the plurality of crystalline patterned semiconductor structures having vertical sidewalls.

18. The method of claim 17, further comprising removing the nitride hard mask from the third crystalline semiconductor layer after oxidizing the plurality of crystalline patterned semiconductor structures and before selectively etching the second crystalline semiconductor layer.

19. The method of claim 10, further comprising
forming a gate insulator layer over the plurality of FinFET channel regions;
forming a conductive gate layer over the gate insulator layer; and
selectively etching the conductive gate layer to form a one or more FinFET gate electrodes.

20. A method for forming a FinFET structure, comprising:
providing a double semiconductor-on-insulator (SOI) substrate comprising a monocrystalline top SOI layer and a monocrystalline bottom SOI layer;
patterning and etching the monocrystalline top SOI layer to form an etch mask comprising a plurality of monocrystalline dummy structures having a predetermined minimum pitch;
thermally oxidizing the plurality of monocrystalline dummy structures to form uniform oxide sidewall spacers;
removing any remaining portion of the plurality of monocrystalline dummy structures while substantially retaining the uniform oxide sidewall spacers;
selectively etching the monocrystalline bottom SOI layer using the uniform oxide sidewall spacers as an etch mask to form a plurality of FinFET channel regions having a minimum pitch that is less than the predetermined minimum pitch;
forming a gate insulator layer over the plurality of FinFET channel regions;
forming a conductive gate layer over the gate insulator layer; and
selectively etching the conductive gate layer to form one or more FinFET gate electrodes.

* * * * *